(12) United States Patent
Kouno et al.

(10) Patent No.: US 9,810,518 B2
(45) Date of Patent: Nov. 7, 2017

(54) POSITION DETECTOR WITH TRANSMISSION PARTS DEFINING VARYING GAP WIDTH

(71) Applicant: DENSO CORPORATION, Kariya, Aichi-pref. (JP)

(72) Inventors: Naoaki Kouno, Chiryu (JP); Tetsuji Yamanaka, Obu (JP)

(73) Assignee: DENSO CORPORATION, Kariya (JP)

( * ) Notice: Subject to any disclaimer, the term of this patent is extended or adjusted under 35 U.S.C. 154(b) by 163 days.

(21) Appl. No.: 14/142,434

(22) Filed: Dec. 27, 2013

(65) Prior Publication Data
US 2014/0184204 A1 Jul. 3, 2014

(30) Foreign Application Priority Data
Dec. 27, 2012 (JP) .................................. 2012-286097

(51) Int. Cl.
*G01B 7/30* (2006.01)
*G01B 7/14* (2006.01)
(Continued)

(52) U.S. Cl.
CPC .............. *G01B 7/14* (2013.01); *G01B 7/003* (2013.01); *G01B 7/30* (2013.01); *G01D 5/145* (2013.01);
(Continued)

(58) Field of Classification Search
CPC .. G01D 5/2266; G01D 5/2275; G01D 5/2283; G01D 5/145; G01D 5/16;
(Continued)

(56) References Cited

U.S. PATENT DOCUMENTS 6,992,478 B2 * 1/2006 Etherington ........... G01D 5/145
324/207.2
7,088,095 B1 8/2006 Busch
(Continued)

FOREIGN PATENT DOCUMENTS

CN 1934419 A 3/2007
JP 63-153421 6/1988
(Continued)

OTHER PUBLICATIONS

Translation of the detailed description of JP08-292004, obtained from Japan Platform for Patent Information website, obtained on Nov. 3, 2015.*
Office Action (2 pages) dated Dec. 11, 2014, issued in corresponding Japanese Application No. 2012-286097 and English translation (2 pages).
Kouno, et al., U.S. Appl. No. 14/142,456, filed Dec. 27, 2013.
Kouno, et al., U.S. Appl. No. 14/142,168, filed Dec. 27, 2013.
Kouno, et al., U.S. Appl. No. 14/142,195, filed Dec. 27, 2013.
(Continued)

Primary Examiner — David M. Schindler
(74) Attorney, Agent, or Firm — Nixon & Vanderhye P.C.

(57) ABSTRACT

A position detector has a gap for providing a detection range. The gap has a gap width that is greater at the ends of the gap than at a center. Therefore, an amount of a spill magnetic flux and an amount of a direct magnetic flux respectively flowing through a position at and around an end portion of the gap are reduced when compared to a gap having a constant gap width along the direction of relative movement. Namely, the density of magnetic flux which passes through a Hall element that is positioned at each longitudinal end of the gap decreases. Therefore, at or around the ends of the gap, a rate of change of the magnetic flux density detected by the Hall element decreases and the linearity of an output signal from the Hall element is improved.

6 Claims, 11 Drawing Sheets

(51) Int. Cl.
*G01R 33/07* (2006.01)
*G01B 7/00* (2006.01)
*G01D 5/14* (2006.01)
*G01D 5/244* (2006.01)

(52) U.S. Cl.
CPC ....... *G01D 5/24433* (2013.01); *G01R 33/072* (2013.01)

(58) Field of Classification Search
CPC ...... G01D 5/20; G01D 5/2006; G01D 5/2013; G01D 5/202; G01D 5/2026; G01D 5/2033; G01D 5/204; G01D 5/2046; G01D 5/2053; G01D 5/206; G01D 5/22; G01D 5/2208; G01D 5/2216; G01D 5/2225; G01D 5/2233; G01D 5/2241; G01D 5/225; G01D 5/2258; G01D 5/14; G01D 5/142; G01D 5/147; G01B 7/02; G01B 7/023; G01B 7/04; G01B 7/046; G01B 7/14; G01B 7/305; G01B 7/31; G01B 7/312; G01B 7/30; H01L 43/00; H01L 43/06; H01L 43/08; G01R 33/0094; G01R 5/20; G01R 15/202; G01R 15/205

See application file for complete search history.

(56) References Cited

U.S. PATENT DOCUMENTS

| | | | | |
|---|---|---|---|---|
| 7,151,369 | B1* | 12/2006 | Wolf | G01D 5/145 324/207.25 |
| 2003/0112006 | A1* | 6/2003 | Luetzow | G01D 5/145 324/207.21 |
| 2007/0279049 | A1* | 12/2007 | Johnson | G01D 5/145 324/207.25 |

FOREIGN PATENT DOCUMENTS

| | | |
|---|---|---|
| JP | 2-83411 | 6/1990 |
| JP | 08-292004 | 11/1996 |
| JP | 10-104044 | 4/1998 |
| JP | 2009-085913 | 4/2009 |
| JP | 2014-126553 | 7/2014 |
| WO | WO 2009/044629 A1 | 4/2009 |

OTHER PUBLICATIONS

Kouno, et al., U.S. Appl. No. 14/142,154, filed Dec. 27, 2013.
Kouno, et al., U.S. Appl. No. 14/142,146, filed Dec. 27, 2013.
Yamanaka, et al., U.S. Appl. No. 14/142,133, filed Dec. 27, 2013.

* cited by examiner

POSITION DETECTOR WITH TRANSMISSION PARTS DEFINING VARYING GAP WIDTH

CROSS-REFERENCE TO RELATED APPLICATION

The present application is based on and claims the benefit of priority of Japanese Patent Application No. 2012-286097 filed on Dec. 27, 2012, the disclosure of which is incorporated herein by reference.

TECHNICAL FIELD

The present disclosure generally relates to a position detector for detecting a position of a detection object.

BACKGROUND

Generally, a magnetic-type position detector detects a change in the position of a detection object relative to a reference part. For example, a position detector disclosed in a patent document 1 (i.e., Japanese Patent Laid-Open No. JP-A-H08-292004) is configured (i) to form a closed magnetic circuit with two magnets and two yokes. The position detector also has a magnetic flux density detector disposed inside of the closed magnetic circuit within a gap between the two yokes. Each of the two yokes has a flat board shape, and the width of the gap between the two yokes is constant along the longitudinal direction of the yoke and at all positions throughout the entire longitudinal length of the two yokes. The two flat board shape yokes generally bind or sandwich the two magnets. That is, one of the two magnets is positioned between a first end of each yoke and the other one of the two magnets is positioned between a second end of each yoke.

Magnetic fluxes flowing out from an N pole of one magnet are categorized into three types, a return magnetic flux that flows through one of the two yokes and flowing from one magnet to the other magnet, a spill magnetic flux that flows from one yoke into the gap between the two yokes and flows to the other yoke, and a direct magnetic flux that flows directly without passing through any yoke into the gap between the two yokes and flows to an S pole. The magnetic flux density detector detects the following two types of flux flowing therein, that is, either one or both of the spill magnetic flux and the direct magnetic flux. The density of the magnetic flux passing through the magnetic flux density detector changes according to a position of the magnetic flux density detector relative to the yoke. The position detector detects a position of the detection object based on the density of the magnetic flux which is detected by the magnetic flux density detector.

In the position detector disclosed in the patent document 1, the density of the magnetic flux which passes through a magnetic flux density detector steeply changes due to the influence of the direct magnetic flux flowing in an end portion of the gap between the two yokes. Therefore, the relationship between the position of the detection object and the output signal from the magnetic flux density detector (i.e., a position-output correlation) is observed as having a linear relationship when the magnetic flux density detector moves at or around a center part of the gap relative to the two yokes, but the position-output correlation departs from such linear relationship when the magnetic flux density detector moves at or around the end portions of the gap relative to the two yokes. In other words, the output signal from the magnetic flux density detector is not sufficiently linear.

SUMMARY

It is an object of the present disclosure to provide a position detector with a magnetic flux density detector that outputs a signal with improved linearity.

In an aspect of the present disclosure, a position detector detects a position of a detection object relative to a reference part. The position detector includes a first magnetic flux transmission part disposed on one of the reference part or the detection object. The first magnetic flux transmission part has a first end and a second end and a second magnetic flux transmission part disposed to define a gap between the first magnetic flux transmission part and the second magnetic flux transmission part. The second magnetic flux transmission part has a first end and a second end. A first magnetic flux generator is positioned between the first end of the first magnetic flux transmission part and the first end of the second magnetic flux transmission part. A second magnetic flux generator is positioned between the second end of the first magnetic flux transmission part and the second end of the second magnetic flux transmission part. A magnetic flux density detector positioned within the gap, disposed on an other of the reference part or the detection object, and outputting a signal according to a density of a magnetic flux passing through the magnetic flux density detector.

Specifically, in the present disclosure, when assuming that a gap width of the gap is defined by a widthwise measurement of the gap in an orthogonal direction between the first magnetic flux transmission part and the second magnetic flux transmission part, a direction of relative movement is defined as a direction of movement of the magnetic flux density detector relative to the first magnetic flux transmission part, and a range of movement is defined as a range of movement of the magnetic flux density detector within the gap, a gap width at each end position of the range of movement of the magnetic flux density detector along the direction of relative movement is greater than a gap width at a center of the range of movement of the magnetic flux density detector along the direction of relative movement.

Therefore, the spill magnetic flux and the direct magnetic flux flowing at each end position of the gap are reduced relative to a position detector having a constant gap width along the entire direction of relative movement. That is, the density of magnetic flux which passes through the magnetic flux density detector when the magnetic flux density detector is positioned at each longitudinal end of the gap decreases. Therefore, when the magnetic flux density detector moves at or around the ends of the gap relative to the magnetic flux transmission part, a rate of change in the magnetic flux density which is detected by the magnetic flux density detector becomes relatively small. Therefore, the linearity of the output signal from the magnetic flux density detector is improved.

Further, when assuming a detection range is defined as an angular range of the gap within which a position of the detection object is detected, an actual output line represents a relationship between a position of the detection object and an output signal of the magnetic flux density detector, a point 0 is defined as a point on the actual output line at which the density of the magnetic flux passing through the magnetic flux density detector is equal to zero, an ideal straight line is defined as a line diagram passing through the point 0 and having an ideal slope, a maximum point is defined as a point on the ideal straight line within the detection range at which the output signal is at a maximum; and a minimum point is defined as a point on the ideal straight line within the detection range at which the output signal is at a minimum, the gap is configured to have the actual output line passing through at least the minimum point, the point 0, and the maximum point.

Even further, the gap is defined by a first inside surface of the first magnetic flux transmission part and a second inside surface of the second magnetic flux transmission part, and each of the first inside surface and the second inside surface is a curved surface having a constant radius of curvature.

Additionally, the gap is defined by a first inside surface of the first magnetic flux transmission part and a second inside surface of the second magnetic flux transmission part, and each of the first inside surface and the second inside surface is a free-form surface that enables the actual output line to extend along the ideal straight line.

Moreover, the detection object rotates relative to the reference part, and the first magnetic flux transmission part and the second magnetic flux transmission part have an arc shape that extends along a direction of relative movement of the detection object with respect to the reference part.

Further, the detection object moves linearly relative to the reference part, and the first magnetic flux transmission part and the second magnetic flux transmission part have a linear shape that linearly extends along the direction of relative movement of the detection object with respect to the reference part.

BRIEF DESCRIPTION OF THE DRAWINGS

Other objects, features and advantages of the present disclosure become more apparent from the following detailed description with reference to the accompanying drawings, in which.

DETAILED DESCRIPTION

Plural embodiments of the present disclosure are described based on the drawings. Like parts have like numbers in the drawings and the description of the same is not repeated for the brevity of the description.

First Embodiment

Figure 1:
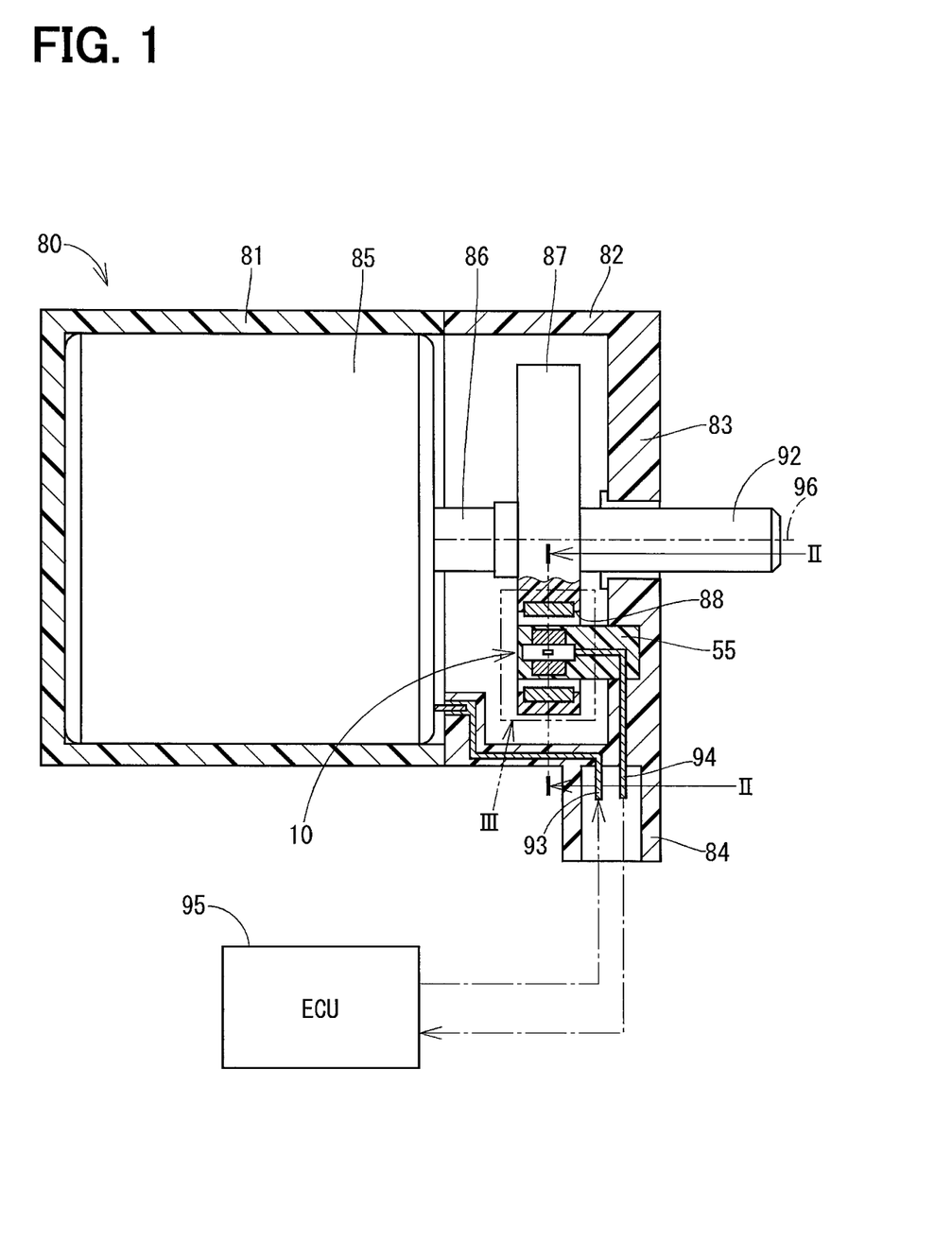
FIG. 1 is an outline configuration diagram of a rotary drive apparatus to which a position detector in a first embodiment of the present disclosure is applied.

The position detector in the first embodiment of the present disclosure is applied to a rotary drive apparatus shown in FIG. 1. A rotary drive apparatus 80 is used to perform an open-and-close drive of a wastegate valve (not illustrated). In a turbocharged engine, the wastegate valve diverts a flow of exhaust gas around the turbine housing of a turbocharger.

First, the configuration of the rotary drive apparatus 80 is explained based on FIG. 1. The rotary drive apparatus 80 is provided with a housing 81, a case 82, a motor 85, a rotating body 87, an output shaft 92, and a position detector 10.

The housing 81 has a cavity for a motor. The housing 81 may be fixed onto a vehicle body or onto a member that is attached to the vehicle body.

The case 82 forms a cover part 83 that is fixed to an opening of the housing 81. The case 82 also has a connector part 84 that projects toward an outside of the case 82 from the cover part 83.

The motor 85 is positioned in the housing 81 and is electrically connected to an electronic control unit (ECU) 95 via a power terminal 93. The motor 85 rotates a motor shaft 86 when electric power is supplied by the ECU 95.

The rotating body 87 is a disk member that is coaxially disposed on the motor shaft 86. The rotating body 87 has an arc-shape through-hole 88 that extends in a circumferential direction at a position away from an axial center 96 of the disk shape. The rotating body 87 is connected to the motor shaft 86, which enables a transmission of rotation of the body 87 to the motor shaft 86.

The output shaft 92 is coaxially disposed on the motor shaft 86 and is rotatably supported by the case 82. The output shaft 92 is also connected to the rotating body 87, which enables a transmission of rotation of the body 87 to the shaft 92. The output shaft 92 is connected to the wastegate valve via a linkage mechanism which is not illustrated.

The position detector 10 is disposed at a position along the motor shaft 86 having the same axial position as the rotating body 87. The position detector 10 is also disposed at a radial position (i.e., a position along a radius of the apparatus 80) that is eccentrically shifted away from the axial center 96, for detecting a relative rotation angle of the rotating body 87 relative to the case 82. The case 82 may be equivalent to a reference part in the claims, and the rotating body 87 may be equivalent to a detection object in the claims. The position detector 10 is electrically connected to the ECU 95 via a signal terminal 94.

When the electric power is supplied from the ECU 95, the rotary drive apparatus 80 rotates the output shaft 92 by the motor 85 and outputs a voltage according to a rotation angle of the rotating body 87 from the position detector 10 to the ECU 95. The ECU 95 drives the motor 85 based on the output voltage of the position detector 10, and performs a feedback control so that the rotation angle of the rotating body 87 matches with a target value.

Figure 2:
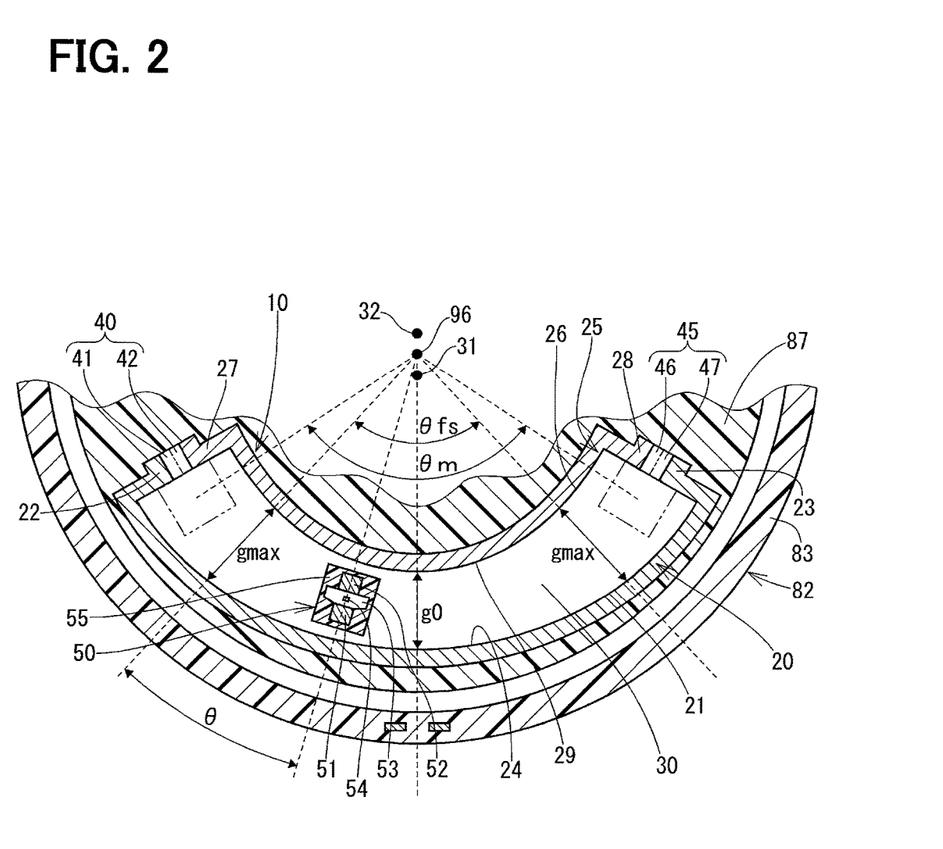
FIG. 2 is a sectional view along line II-II of FIG. 1.
Figure 3:
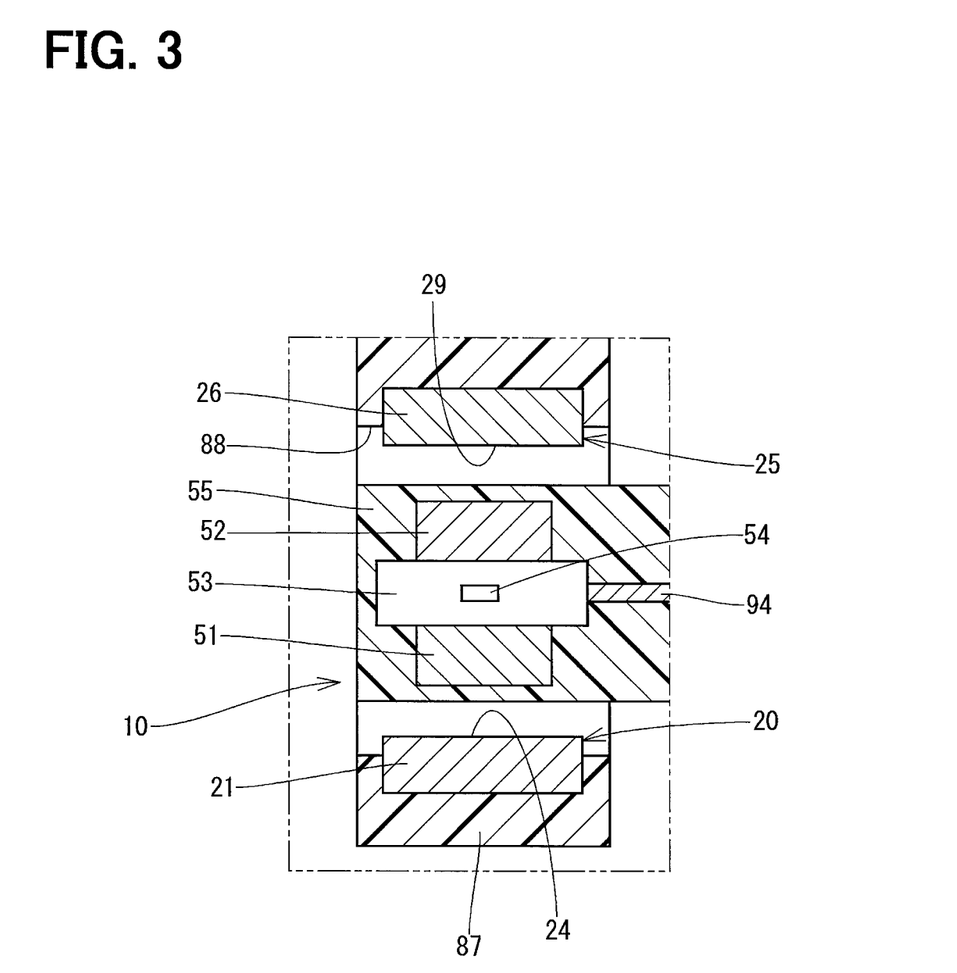
FIG. 3 is an expanded sectional view of an arrow III indicated portion of FIG. 1.

The configuration of the position detector 10 is explained based on FIGS. 1 to 3 in the following.

The position detector 10 is provided with a first yoke 20, a second yoke 25, a first magnet 40, a second magnet 45, and a short-circuiting magnetic path part 50.

The first yoke 20 is made of a soft magnetic material, and forms an outer arc portion 21 that extends along an inward-facing wall 89 of the through-hole 88 of the rotating body 87. Further, the first yoke 20 extends from a first end 22 of the first yoke 20 to a second end 23 of the first yoke 20. The first yoke 20 is fixed onto the rotating body 87, and may be equivalent to a first magnetic flux transmission part in the claims.

The second yoke 25 is made of a soft magnetic material, and forms an inner arc portion 26 that extends along the outward-facing wall 91 of the through-hole 88 of the rotating body 87. Further, the second yoke 25 extends from a first end 27 of the second yoke 25 to a second end 28 of the second yoke 25. The outer arc portion 21 of the first yoke 20 and the inner arc portion 26 of the second yoke 25 define a gap 30. The gap 30 has an arc shape extending in the circumferential direction of the case 82. The second yoke 25 is fixed onto the rotating body 87, and may be equivalent to a second magnetic flux transmission part in the claims.

The first magnet 40 is disposed at a position between the first end 22 of the first yoke 20 and the first end 27 of the second yoke 25, and may be equivalent to a first magnetic flux generator in the claims. In the present embodiment, the magnetization direction of the first magnet 40 matches with a radial direction of the rotating body 87. As such, an N pole 41 is positioned toward a radial outside of the magnet 40 and an S pole 42 is positioned toward a radial inside of the magnet 40.

The second magnet 45 is disposed at a position between the second end 23 of the first yoke 20 and the second end 28 of the second yoke 25, and may be equivalent to a second magnetic flux generator in the claims. In the present embodiment, the magnetic force of the second magnet 45 is the same as the magnetic force of the first magnet 40. The magnetization direction of the second magnet 45 matches with a radial direction of the rotating body 87. As such, an N pole 46 is positioned toward a radial inside of the magnet 45 and an S pole 47 is positioned toward a radial outside of the magnet 45. That is, the polarity of the second magnet 45 is opposite to the polarity of the first magnet 40.

The first yoke 20 and the second yoke 25 are magnetic circuit components which connect the first magnet 40 and the second magnet 45, and form a closed magnetic circuit together with the first magnet 40 and the second magnet 45. Magnetic fluxes flowing out from the N pole 41 of the first magnet 40 include a return magnetic flux that flows through the first yoke 20 to flow to the second magnet 45, a spill magnetic flux that flows from the first yoke 20 through the gap 30 to flow to the second yoke 25, and a direct magnetic flux that flows through the gap 30 to the S pole 42 without passing through the first yoke 20 and the second yoke 25. Further, magnetic fluxes flowing out from the N pole 46 of the second magnet 45 include a return magnetic flux that flows through the second yoke 25 to flow to the first magnet 40, a spill magnetic flux that flows from the second yoke 25 through the gap 30 to flow to the first yoke 20, and a direct magnetic flux that flows through the gap 30 to the S pole 47 without passing through the first yoke 20 and the second yoke 25.

The short-circuiting magnetic path part 50 has a Hall IC 53, a magnetic flux collecting yokes 51, 52 for collecting and concentrating a leak magnetic flux to flow to the Hall IC 53. The magnetic flux collecting yokes 51, 52 and the Hall IC 53 are positioned on a molded member 55 that is made of resin. The molded member 55 is fixed onto the case 82. The magnetic flux collecting yoke 51, 52 are disposed so that the magnetic flux collecting yoke 51, 52 are radially aligned within the gap 30. The Hall IC 53 is disposed at a position between the magnetic flux collecting yoke 51, 52 and has a Hall element 54. The Hall element 54 is a magneto-electric transducer using the Hall effect, and may be equivalent to a magnetic flux density detector in the claims. The Hall element 54 outputs a voltage according to the density of the magnetic flux passing through its magneto-sensitive surface. The density of the magnetic flux passing through the Hall element 54 varies by increasing or decreasing when the position of the Hall element 54 relative to a closed magnetic circuit changes according to the relative rotation of the rotating body 87. In the present embodiment, one Hall element 54 is disposed.

Figure 4:
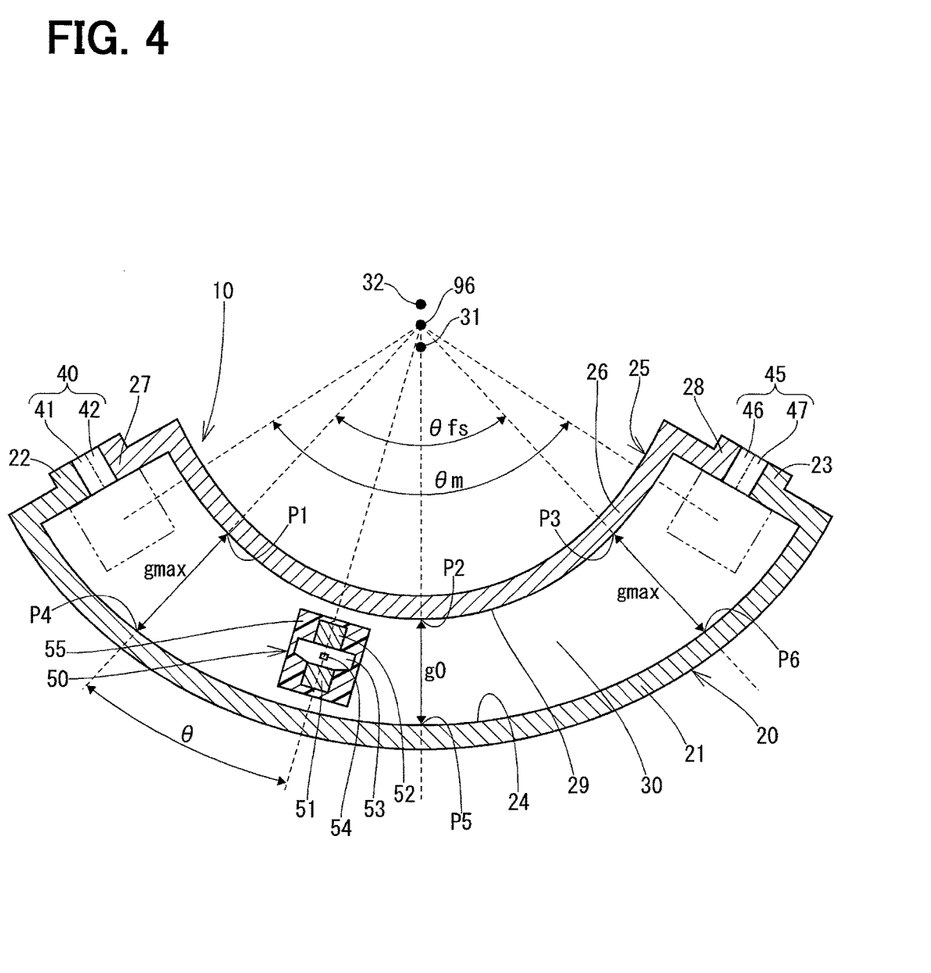
FIG. 4 is a sectional view of the position detector of FIG. 2.
Figure 5:
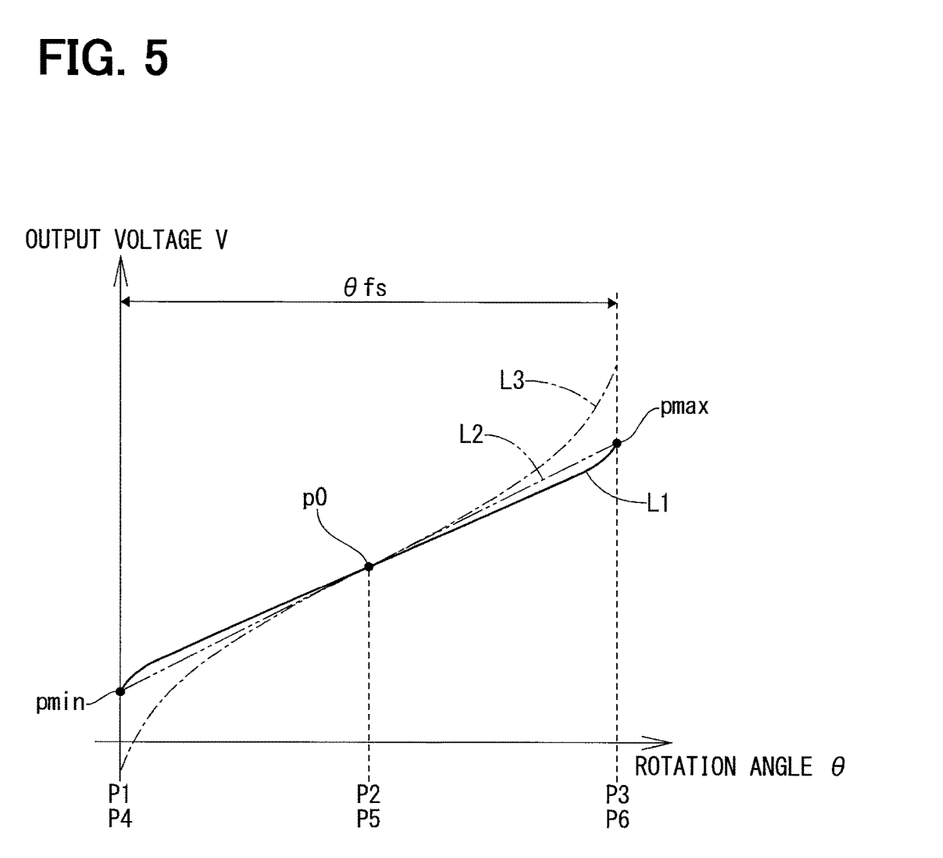
FIG. 5 is a diagram of an output characteristic of a Hall element of FIG. 2.

Next, the feature of each of the components of the position detector 10 is described based on FIGS. 4 and 5. The following description assumes that (i) the dimension, or the gap width, of the gap 30 between the first yoke 20 and the second yoke 25 is taken along the radial direction, i.e., along the radius of the cylinder shape of the apparatus 80, and (ii) the first and second yokes 20, 25 move in a direction of relative movement with respect to the short-circuiting magnetic path part 50. Further, an angle range that is detectable by using the position detector 10 is designated as a detection range θfs, and a range of movement of the Hall element 54, within which a relative movement of the Hall element 54 with respect to the first yoke 20 in the gap 30 allowed, is designated as a range of movement θm.

As shown in FIG. 4, a first inside surface 24, that is a part of the outer arc portion 21 of the first yoke 20 defining the gap 30, is a curved surface that has a constant radius of curvature passing through (i.e., is defined by) three points. That is, the curved surface is defined by a fourth position P4, a fifth position P5, and a sixth position P6, which are respectively (i) one end of the detection range θfs along the direction of relative movement, (ii) a center of the detection range θfs along the direction of relative movement and (iii) the other end of the detection range θfs along the direction of relative movement. According to the present embodiment, a center axis of curvature 32 of the first inside surface 24 is located on an opposite side of the axial center 96 relative to the outer arc portion 21.

Further, a second inside surface 29, that is a part of the inner arc portion 26 of the second yoke 25 defining the gap 30, is a curved surface that has a constant radius of curvature passing through other three points. That is, the curved surface is defined by a first position P1, a second position P2, and a third position P3, which are respectively (i) one end of the detection range θfs along the direction of relative movement, (ii) a center of the detection range θfs along the direction of relative movement and (iii) the other end of the detection range θfs along the direction of relative movement. According to the present embodiment, a center axis of curvature 31 of the second inside surface 29 is located between the inner arc portion 26 and the axial center 96.

According to the above-described configuration, the gap width of the gap 30 continuously increases from the center to the both ends of the direction of relative movement within the detection range θfs, to have the gap width gmax at both end positions being greater than the gap width g0 at the center of the detection range θfs. Hereafter, the characteristic of the output of the position detector 10 is described with reference to the diagram in FIG. 5 regarding the first position P1 to the sixth position P6.

FIG. 5 describes a relationship between a relative rotation angle θ of the rotating body 87 relative to the case 82 and an output voltage V of the Hall element 54, which is an actual output line L1 illustrated as a solid line in the diagram. The rotation angle θ may be equivalent to a position of a detection object in claims, and the output voltage V may be equivalent to an output signal in claims. Further, in FIG. 5, another line represented by a two-dot chain line which is an ideal straight line L2, is drawn as (i) having a point p0 which is a point on the output line L1 and where the density of the detected magnetic flux passing through the Hall element 54 is equal to zero and (ii) having an ideal slope of 'a'.

Furthermore, in FIG. 5, a dashed-dotted line, which is an output line L3, illustrates a relationship between a rotation angle θ and an output voltage V in which the gap width is constant along the direction of relative movement.

When, in FIG. 5, a point on the ideal straight line L2, within the detection range θfs at which the output voltage V is at a minimum, is designated as a minimum point pmin. A gap width gmax in FIG. 4, which is a distance between the first position P1 and the fourth position P4, is set to correspond to the minimum point pmin in FIG. 5.

Further, the gap width g0 in FIG. 4, which is a distance between the second position P2 and the fifth position P5, is set to correspond to the point p0 in FIG. 5.

Further, when, in FIG. 5, a point on the ideal straight line L2 within the detection range θfs, at which the output voltage V is at a maximum, is designated as a maximum point pmax. A gap width gmax in FIG. 4, which is a distance between the third position P3 and the sixth position P6, is set to correspond to the maximum point pmax in FIG. 5.

As described above, in the position detector 10 in the first embodiment, the gap 30 is configured to have a greater gap width gmax at both end positions in the direction of relative movement within the detection range θfs, which is greater than the gap width g0 at the center of the detection range θfs. Therefore, the spill magnetic flux and the direct magnetic flux flowing at each end position of the gap are reduced, which has a constant gap width for the entire gap along the direction of relative movement. That is, the density of magnetic flux which passes through the Hall element 54 when the Hall element 54 is positioned at each longitudinal end of the gap 30 decreases. Therefore, when the Hall element 54 moves at or around the ends of the gap 30, a rate of change of the magnetic flux density, which is detected by the Hall element 54, becomes relatively small. Therefore, the linearity of the output signal from the Hall element 54 is improved.

Further, in the first embodiment, the gap 30 is defined so that the actual output line L1 passes through the minimum point pmin, the point p0, and the maximum point pmax. Therefore, the detection accuracy at both ends of the detection range θfs is improved.

Further, in the first embodiment, the first inside surface 24 and the second inside surface 29 are curved surfaces and have a constant curvature radius. Therefore, the first yoke 20 and the second yoke 25 may have a simple shape that provides efficient design and manufacture.

Second Embodiment

Figure 6:
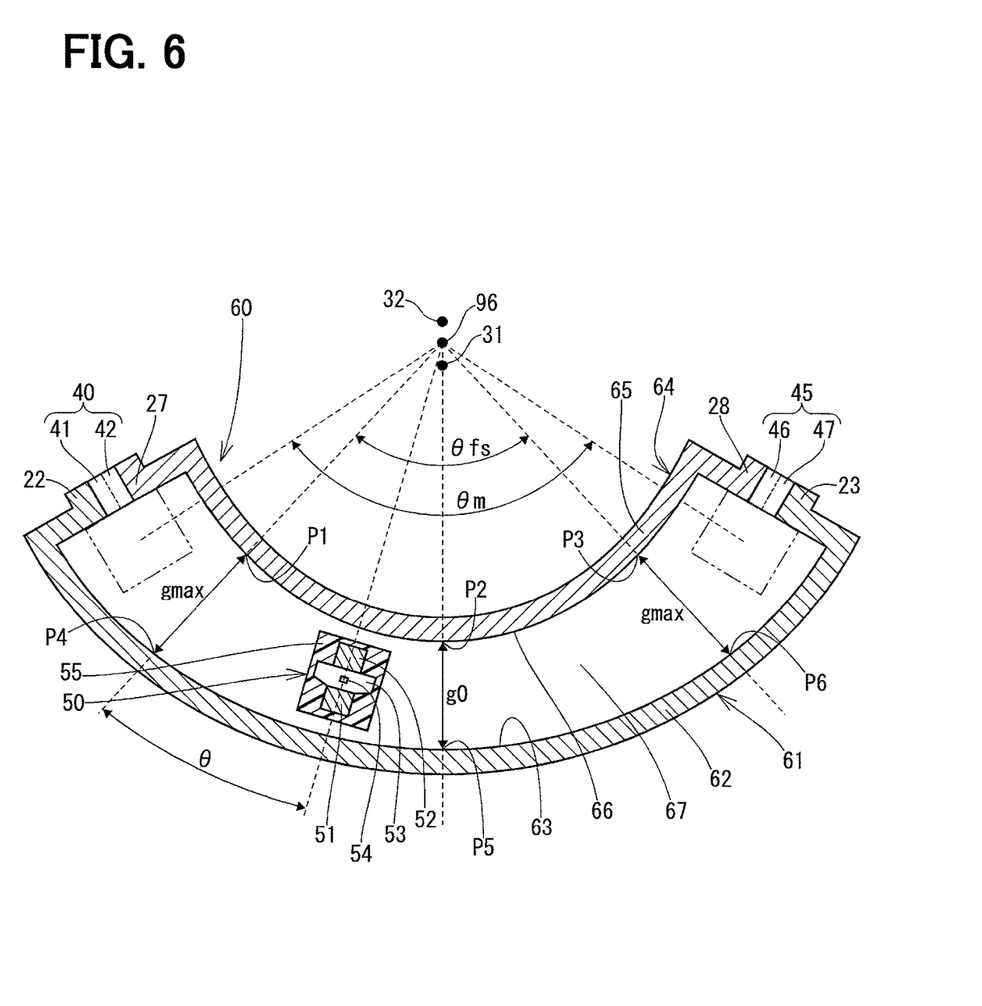
FIG. 6 is a sectional view of the position detector in a second embodiment of the present disclosure.
Figure 7:
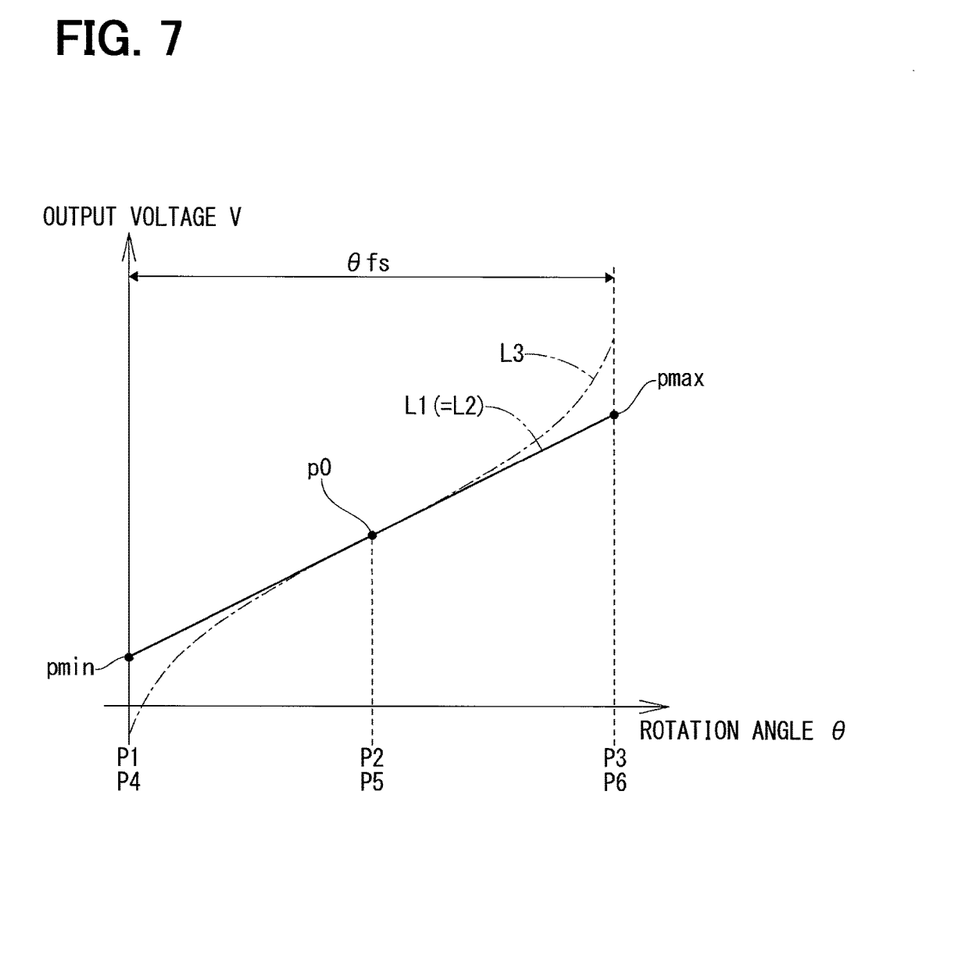
FIG. 7 is a diagram of an output characteristic of a Hall element of FIG. 6.

The position detector in the second embodiment of the present disclosure is explained based on FIGS. 6 and 7.

As shown in FIG. 6, a position detector 60 is provided with a first yoke 61 and a second yoke 64. A gap 67 between an outer arc portion 62 of the first yoke 61 and an inner arc portion 65 of the second yoke 64 is configured to have a greater gap width gmax at both end positions in the direction of relative movement within the detection range θfs, which is greater than the width g0 at the center of the detection range θfs. Therefore, according to the second embodiment, the linearity of the output voltage V of the Hall element 54 is improved in the same manner as the first embodiment.

Further, a first inside surface 63 of the outer arc portion 62 of the first yoke 61 and a second inside surface 66 of the inner arc portion 65 of the second yoke 64 are a free-form surface that is configured to position the actual output line L1 such that the actual output line L1 extends along the ideal straight line L2, as shown in FIG. 7. Therefore, the linearity of the output voltage V of the Hall element 54 is further improved.

Third Embodiment

Figure 8:
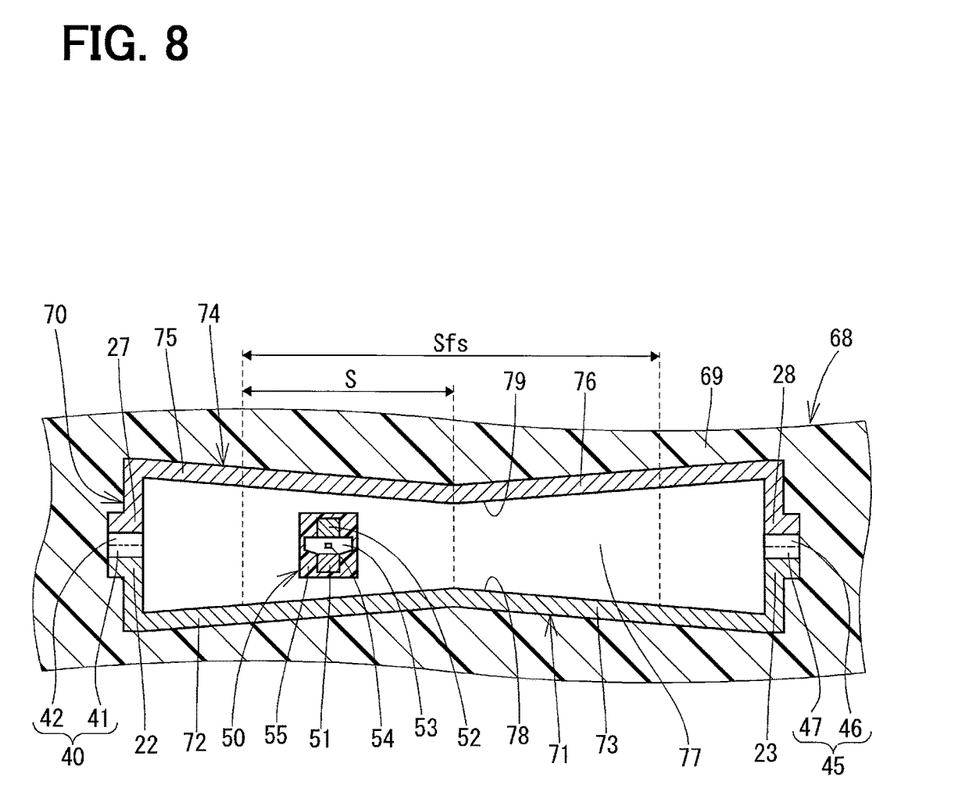
FIG. 8 is a sectional view of the position detector in a third embodiment of the present disclosure.
Figure 9:
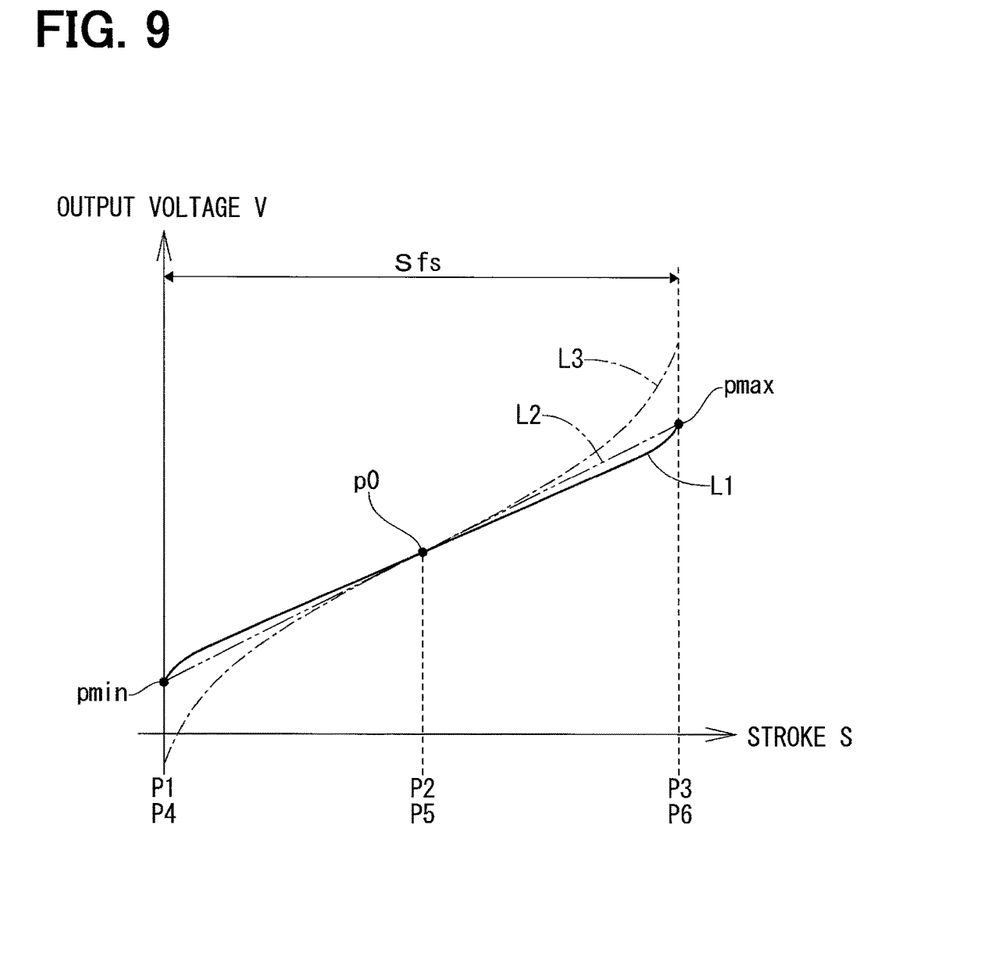
FIG. 9 is a diagram of an output characteristic of a Hall element of FIG. 8.

The position detector in the third embodiment of the present disclosure is explained based on FIGS. 8 and 9.

As shown in FIG. 8, a position detector 70 is applied to a shift actuator 68. The shift actuator 68 is an actuator which is disposed in a gearbox of an automated manual transmission or a dual clutch transmission, for example, and performs a shift operation and a selection operation. An output member 69 of the shift actuator 68 moves relative to a housing (not illustrated), which is a relative linear movement. The position detector 70 may detect a movement relative to the housing. In other words, the position detector 70 may detect a stroke S of the output member relative to a housing. The output member 69 may be equivalent to a detection object in claims, and the above-mentioned housing may be equivalent to a reference part in claims.

The position detector 70 has a closed magnetic circuit that includes a first yoke 71, a second yoke 74, a first magnet 40, and a second magnet 45. The first yoke 71 is formed substantially in a straight shape extending along the direction of relative movement, which includes a first straight part 72 that extends from a center of the first yoke 71 to one end of the range of movement and a second straight part 73 that extends from the center of the first yoke 71 to the other end of the range of movement. Further, the second yoke 74 is formed substantially in a straight shape extending along the direction of relative movement, which includes a third straight part 75 that extends from a center of the second yoke 74 to one end of the range of movement and a fourth straight part 76 that extends from the center of the second yoke 74 to the other end of the range of movement.

The first yoke 71 defines a gap 77 at a position between itself and the second yoke 74. The width of the gap 77 continuously increases from the center toward both ends of the first yoke 71 along the direction of relative movement, which results in the gap width gmax at both ends of the range of movement in a detection range Sfs being greater than the gap width g0 at the center of the range of movement in the range Sfs. Therefore, according to the third embodiment, the linearity of the output voltage V of the Hall element 54 with respect to the stroke S of output member 69 of the shift actuator 68 is improved in the same manner as the first embodiment.

Further, the gap 77 is configured to have the actual output line L1 passing through all of the minimum point pmin, the point p0, and the maximum point pmax on the ideal straight line L2, as shown in FIG. 9. Therefore, the detection accuracy at and around the end of the detection range Sfs is improved.

Further, a first inside surface 78 of the first yoke 71 and a second inside surface 79 of the second yoke 74 are respectively formed by two planes. Therefore, the first yoke 71 and the second yoke 74 are respectively enabled to have a simple shape, allowing an easy design and manufacture of them.

Fourth Embodiment

Figure 10:
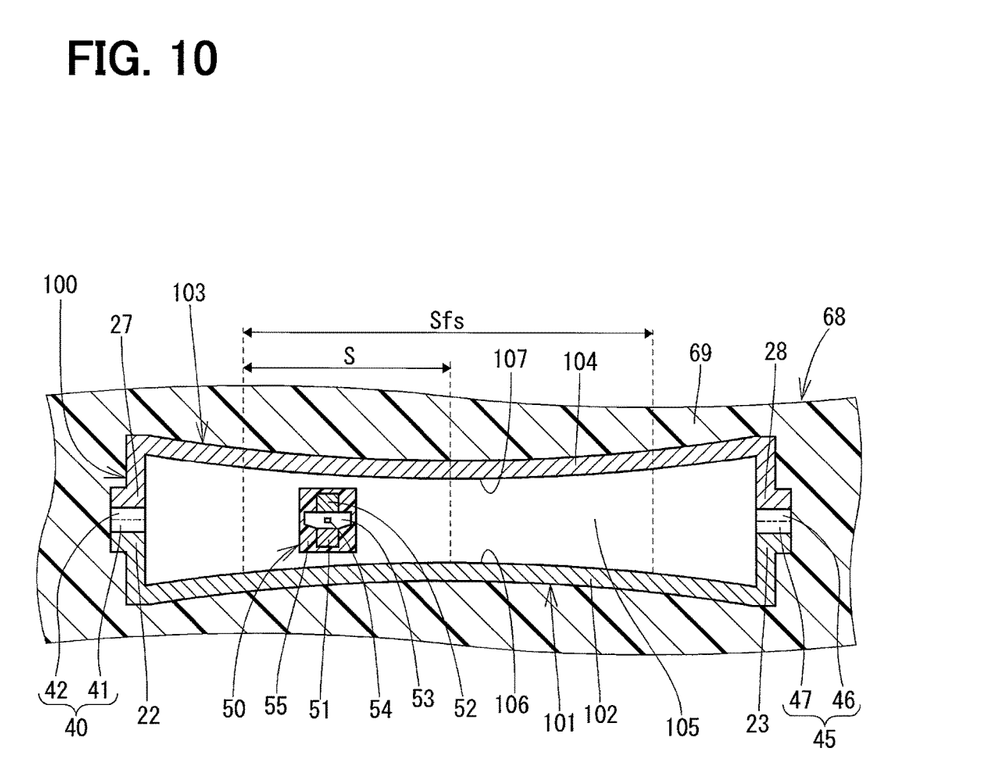
FIG. 10 is a sectional view of the position detector in a fourth embodiment of the present disclosure.
Figure 11:
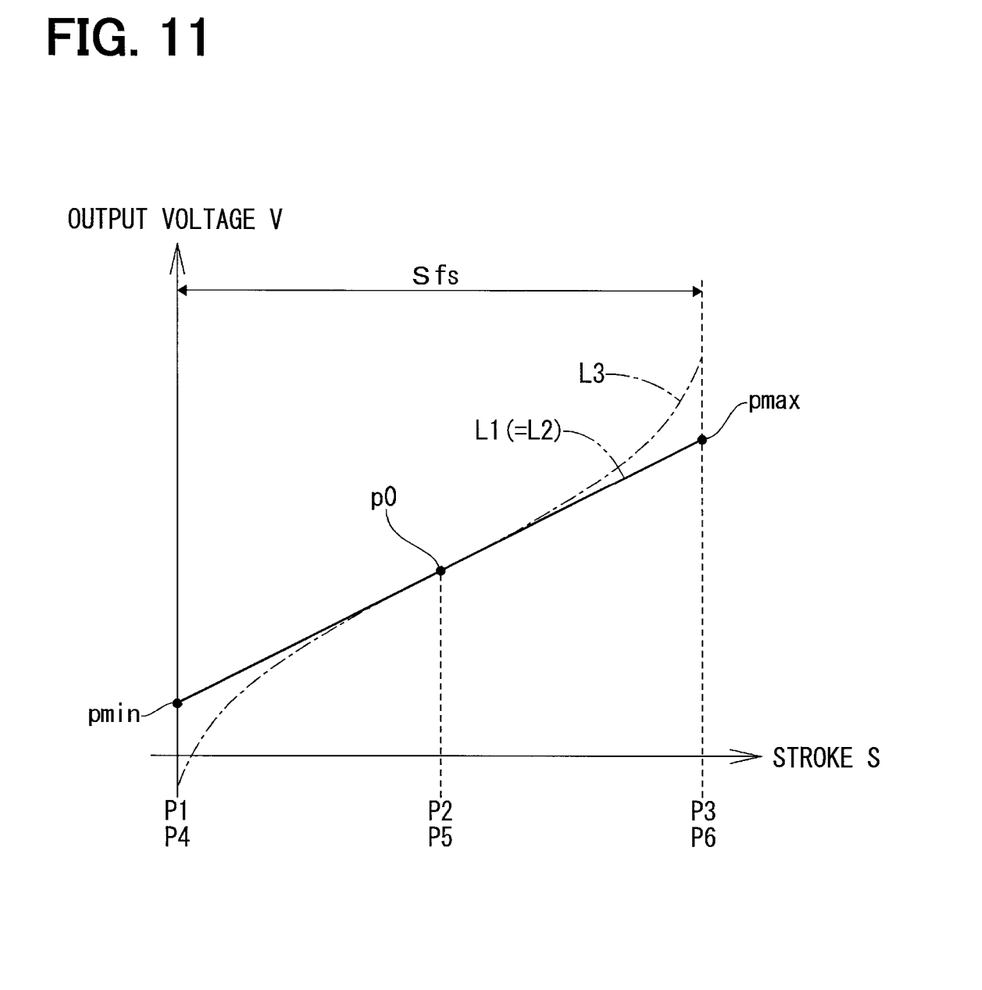
FIG. 11 is a diagram of an output characteristic of a Hall element of FIG. 10.

The position detector in the fourth embodiment of the present disclosure is explained based on FIGS. 10 and 11.

As shown in FIG. 10, a position detector 100 is provided with a first yoke 101 and a second yoke 103. A gap 105 between an arc part 102 of the first yoke 101 and an arc part 104 of the second yoke 103 is configured to have the greater gap width gmax at both ends of the gap 105 in the detection range Sfs along the direction of relative movement, which is greater than the gap width g0 at the center of the detection range Sfs. Therefore, according to the fourth embodiment, the linearity of the output voltage V of the Hall element 54 is improved in the same manner as the first embodiment.

A first inside surface 106 of the arc part 102 of the first yoke 101 and a second inside surface 107 of the arc part 104 of the second yoke 103 are a free-form surface that is configured to put the actual output line L1 to extend along the ideal straight line L2, as shown in FIG. 11. Therefore, the linearity of the output voltage V of the Hall element 54 is further improved.

OTHER EMBODIMENTS

According to other embodiments of the present disclosure, a closed-circuit formation member may be disposed in a case, and a Hall IC may be provided on the rotating body.

According to other embodiments of the present disclosure, the first magnet and the second magnet may be replaced with, for example, a magnetic flux generator of other type, such as an electric magnet or the like.

According to other embodiments of the present disclosure, a position detector may be disposed on other rotating parts or components, such as a final speed reduction member of a speed reducer that is disposed as a component between a motor and an output shaft.

According to other embodiments of the present disclosure, a rotary drive apparatus may be applied not only to a wastegate valve device but also to other devices, such as a variable vane controller having a variable turbo capacity, a valve operation device for an exhaust gas throttle or an exhaust gas switch valve, a valve operation device for a variable air intake mechanism and the like.

Although the present disclosure has been fully described in connection with the above embodiment thereof with reference to the accompanying drawings, it is to be noted that various changes and modifications will become apparent to those skilled in the art, and such changes and modifications are to be understood as being within the scope of the present disclosure as defined by the appended claims.

What is claimed is:

1. A position detector detecting a position of a detection object that moves relative to a reference part, the position detector comprising:
a first magnetic flux transmission part disposed on one of the reference part or the detection object, the first magnetic flux transmission part having a first end and a second end;
a second magnetic flux transmission part disposed to define a gap between the first magnetic flux transmission part and the second magnetic flux transmission part, the second magnetic flux transmission part having a first end and a second end;
a first magnetic flux generator positioned between the first end of the first magnetic flux transmission part and the first end of the second magnetic flux transmission part;
a second magnetic flux generator positioned between the second end of the first magnetic flux transmission part and the second end of the second magnetic flux transmission part; and
a magnetic flux density detector positioned within the gap, disposed on another of the reference part or the detection object, and outputting a signal according to a density of a magnetic flux passing through the magnetic flux density detector, wherein
the gap is defined by a first inside surface of the first magnetic flux transmission part and a second inside surface of the second magnetic flux transmission part, and
each of the first inside surface and the second inside surface is a curved surface having a constant curvature radius,
a gap width of the gap is defined as an orthogonal distance between the first magnetic flux transmission part and the second magnetic flux transmission part,
a direction of relative movement is defined as a direction of movement of the magnetic flux density detector along the first magnetic flux transmission part,
a range of movement is defined as a range of movement of the magnetic flux density detector within the gap,
the gap width at each end position of the range of movement of the magnetic flux density detector along the direction of relative movement is greater than the gap width at a center of the range of movement of the magnetic flux density detector along the direction of relative movement, and
an increase of the gap width from the center to each of the end positions of the range of movement of the magnetic flux density detector is a continuous increase between the center and each of the end positions,
the first magnetic flux transmission part includes an outer arc portion, and
the position detector further comprises an axial center of the range of movement, the first inside surface having a first center axis of curvature spaced apart from the axial center and located on one side of the axial center so that the first center axis of curvature is farther from the outer arc portion than the axial center is to the outer arc portion.

2. The position detector of claim 1, wherein
a detection range is defined as an angular range of the gap within which a position of the detection object is detected,
a point 0 is defined as a point at which the density of the magnetic flux passing through the magnetic flux density detector is equal to zero,
a maximum point is a point within the detection range at which the output signal is at a maximum, and
a minimum point is a point within the detection range at which the output signal is at a minimum,
the gap is configured so that the output signal is such that a straight line passes through at least the minimum point, the point 0, and the maximum point.

3. The position detector of claim 1, wherein
the detection object rotates relative to the reference part, and
the first magnetic flux transmission part and the second magnetic flux transmission part have an arc shape that extends along the direction of relative movement of the detection object with respect to the reference part.

4. The position detector of claim 1, wherein
the end positions includes a first end position adjacent where the first magnetic flux generator is located and a second end position adjacent where the second magnetic flux generator is located opposite the first end position.

5. The position detector of claim 1, wherein
the position detector includes a second center axis of curvature spaced apart from both the axial center and the first center axis of curvature, the second center axis of curvature being located, relative to the axial center, on another side opposite to where the first center axis of curvature is located.

6. The position detector of claim 5, wherein the first inside surface has a first constant curvature radius passing from the first center axis of curvature spaced apart from the axial center to positions along the first inside surface, and the second inside surface has a second constant curvature radius passing from the second center axis of curvature spaced apart from both the axial center and the first center axis of curvature, to positions along the second inside surface.

\* \* \* \* \*